(12) United States Patent
Hashio et al.

(10) Patent No.: US 8,237,435 B2
(45) Date of Patent: Aug. 7, 2012

(54) ASSEMBLING STRUCTURE OF CURRENT DETECTION APPARATUS

(75) Inventors: Shinichi Hashio, Shimada (JP); Toshiro Mochizuki, Shimada (JP); Yasunori Kawaguchi, Shimada (JP); Yasuhiro Sugimori, Shimada (JP)

(73) Assignee: Yazaki Corporation, Tokyo (JP)

( * ) Notice: Subject to any disclaimer, the term of this patent is extended or adjusted under 35 U.S.C. 154(b) by 309 days.

(21) Appl. No.: 12/749,902

(22) Filed: Mar. 30, 2010

(65) Prior Publication Data

US 2010/0259255 A1  Oct. 14, 2010

(30) Foreign Application Priority Data

Apr. 9, 2009 (JP) ................. 2009-094973

(51) Int. Cl.
*G01R 33/02* (2006.01)
(52) U.S. Cl. ...................... 324/244; 324/246
(58) Field of Classification Search ......... None
See application file for complete search history.

(56) References Cited

U.S. PATENT DOCUMENTS 5,942,893 A * 8/1999 Terpay ............... 324/207.18
6,531,862 B1 * 3/2003 Stanley .................. 324/127

FOREIGN PATENT DOCUMENTS

JP      2001-272422 A      10/2001

* cited by examiner

*Primary Examiner* — Minh N Tang
(74) *Attorney, Agent, or Firm* — Sughrue Mion, PLLC (57) ABSTRACT

An assembling structure of a current detection apparatus includes: a bus bar; a sensor main body having a magnetism detection element which detects a magnetism generated from the bus bar; a housing having a sensor compartment which accommodates the sensor main body; a magnetism shield member mounted externally on the housing; a cover that holds the bus bar and the magnetism shield member by the at least part of the upper surface of the cover and the lower surface of the housing therebetween; a projecting portion formed on the cover, which projects upwards from the upper surface of the cover; a hole formed in the bus bar, through which the projecting portion of the cover is inserted; and a hole formed in the lower surface of the housing, which is adapted to fit on the projecting portion which passes through the hole in the bus bar.

8 Claims, 13 Drawing Sheets

ASSEMBLING STRUCTURE OF CURRENT DETECTION APPARATUS

BACKGROUND OF THE PRESENT INVENTION

1. Technical Field

The present invention relates to an assembling structure of a current detection apparatus, the structure enabling the current detection apparatus to be attached to a bus bar without sacrificing accuracy and being suitable for mass production.

2. Background Art

Conventionally, there has been known a current detection apparatus which detects the value of a current flowing between a battery and on-board electrical equipment by detecting a magnetic flux generated from a current flowing to a wiring harness which is connected to a terminal of the battery. The current detection apparatus is mounted on part of a vehicle by use of a jig such as a bracket. Then, the wiring harness is inserted through a detection hole of a current detector of the current detection apparatus, where a magnetic flux is detected.

However, in the conventional current detection apparatus, since the separate component such as the bracket needs to be used to mount the current detector on the vehicle, the number of components is increased, and the configuration of the current detection apparatus becomes complex. Further, since the wiring harness, which is flexible, needs to be inserted through the detection hole, the detection hole needs to be opened wide to cope with a problem in relation to working properties. Due to the problem, it is difficult to realize a reduction in size of the current detection apparatus.

Figure 13:
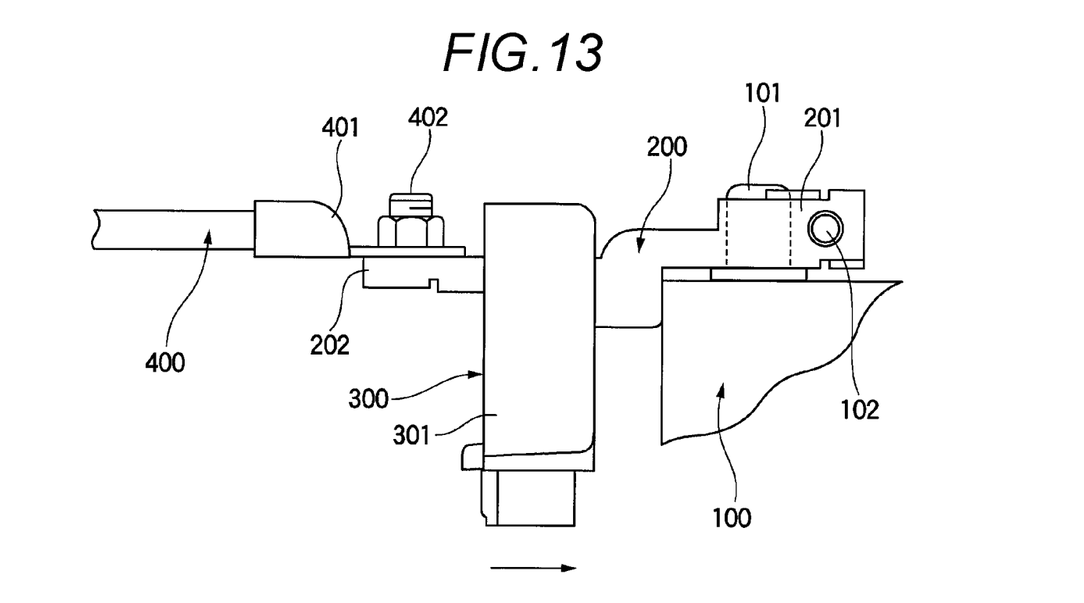
FIG. 13 is a front view showing a conventional current detection apparatus.

To cope with these problems, there has been proposed a vehicle current detection apparatus which improves assembling properties and which is simple in configuration (for example, refer to JP-A-2001-272422). As is shown in FIG. 13, in this current detection apparatus, one end 201 of a bus bar 200 is fastened to a terminal 101 of a battery 100 with a screw 102 for connection, and a current detector 300 is supported on the bus bar 200. In addition, the other end 202 of the bus bar 200 is coupled to a terminal 401 with a screw 402, which terminal clamps to fasten an end portion of a wiring harness 400 which is connected to on-board electrical equipment (not shown) of a vehicle.

Figure 14:
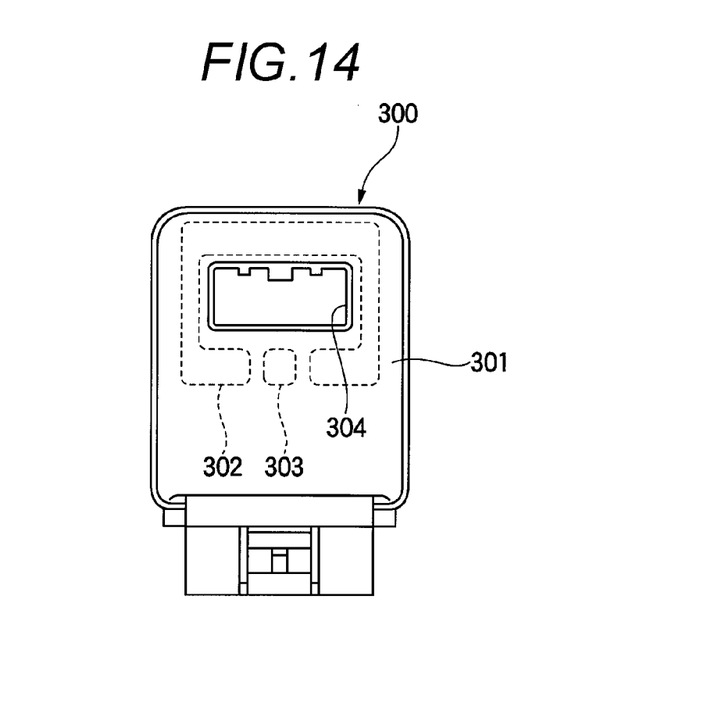
FIG. 14 is a side view of the conventional current detection apparatus.

In addition, in the current detector 300, as is shown in FIG. 14, a core 304 is fixed so as to surround a detection hole 304 through which the bus bar 200 is inserted within a synthetic resin detector main body 301, and a Hall element 303 is mounted so as to be positioned between both ends of the core 32. By doing so, the vehicle current detection apparatus can simply be configured, and a reduction in size thereof can be realized. Further, an increase in assembling properties of the vehicle current detection apparatus can also be realized.

In the conventional current detection apparatus, however, the following drawbacks have been produced. Namely, as described above, since a magnetic material core for collecting a magnetic flux is placed, the core needs to be provided in which the hole is opened through which the bus bar is inserted and the bus bar needs to be inserted through the hole so formed. In addition, in the event that the shape of the bus bar is complex, since it becomes difficult to insert the bus bar through the hole, the hole needs to be opened wide, resulting in enlargement of the magnetic material core.

SUMMARY OF THE PRESENT INVENTION

The present invention has been made in view of the situations, and an object thereof is to provide an assembling structure of a current detection apparatus which is simple in configuration, which is easy to be assembled and which is suitable for reduction in size of the current detection apparatus.

In order to achieve the above object, there is provided an assembling to structure of a current detection apparatus including: a bus bar; a sensor main body having a magnetism detection element which detects a magnetism generated from the bus bar and adapted to calculate a value of a current which flows through the bus bar based on the detected magnetism; a housing having a sensor compartment which accommodates the sensor main body, wherein a lower surface of the housing faces one of surfaces of the bus bar; a magnetism shield member mounted externally on the housing so that the sensor main body and the bus bar are positioned in an interior of the magnetism shield member; a cover at least part of an upper surface of which faces the other surface of the bus bar, so as to hold the bus bar and the magnetism shield member by the at least part of the upper surface of the cover and the lower surface of the housing therebetween; a projecting portion formed on the cover, which projects upwards from the upper surface of the cover; a hole formed in the bus bar, through which the projecting portion of the cover is inserted when the bus bar and the magnetism shield member are held by the at least part of the upper surface of the cover and the lower surface of the housing; and a hole formed in the lower surface of the housing, which is adapted to fit on the projecting portion which passes through the hole in the bus bar when the bus bar and the magnetism shield member are held by the at least part of the upper surface of the cover and the lower house of the housing.

The assembling structure may be configured in that the projecting portion of the cover is formed by a screw which penetrates through the cover from the lower surface towards the upper surface of the cover.

The assembling structure may be configured by including a spacer which covers an opening in the sensor compartment which is made to open in the lower surface of the housing, and in that the spacer is held by the housing and the bus bar therebetween when the bus bar and the magnetism shield member are held by the at least part of the upper surface of the cover and the lower surface of the housing excluding the opening to thereby fix the sensor main body accommodated in the sensor compartment in place in the sensor compartment.

The assembling structure may be configured in that the projecting portion, the hole in the bus bar, and the hole in the housing are provided in two, respectively, and the two projecting portions, the two holes in the bus bar, and the two holes in the housing are disposed at both sides of the current detection apparatus, to arrange the sensor compartment therebetween.

There is also provided an assembling structure of a current detection apparatus including: a bus bar; a sensor main body having a magnetism detection element which detects a magnetism generated from the bus bar and adapted to calculate a value of a current which flows through the bus bar based on the detected magnetism; a housing having a sensor compartment which accommodates the sensor main body, wherein a lower surface of the housing faces one of surfaces of the bus bar; a magnetism shield member mounted externally on the housing so that the sensor main body and the bus bar are positioned in an interior of the magnetism shield member; a cover at least part of an upper surface of which faces the other surface of the bus bar, so as to hold the bus bar and the magnetism shield member by the at least part of the upper surface of the cover and the lower surface of the housing therebetween; a projecting portion formed on the housing, which projects downwards from the lower surface of the housing; a hole formed in the bus bar, through which the projecting portion of the housing is inserted when the bus bar and the magnetism shield member are held by the at least part of the upper surface of the cover and the lower surface of the housing; and a hole formed in the upper surface of the cover, which is adapted to fit on the projecting portion which passes through the hole in the bus bar when the bus bar and the magnetism shield member are held by the at least part of the upper surface of the cover and the lower house of the housing.

The assembling structure may be configured in that the hole formed in the cover is formed so as to extend from the upper surface to the lower surface of the cover, and the projecting portion of the housing is provided to project from the lower surface of the housing, and a distal end portion of the projecting portion which passes through the hole in the bus bar and the hole in the cover is thermally welded in the holes in the cover.

The assembling structure may be configured by including a spacer which covers an opening in the sensor compartment which is made to open in the lower surface of the housing, and in that the spacer is held by the housing and the bus bar therebetween when the bus bar and the magnetism shield member are held by the at least part of the upper surface of the cover and the lower surface of the housing excluding the opening to thereby fix the sensor main body accommodated in the sensor compartment in place in the sensor compartment.

The assembling structure may be configured in that the projecting portion, the hole in the bus bar, and the hole in the cover are provided in two, respectively, and the two projecting portions, the two holes in the bus bar, and the two holes in the cover are disposed at both sides of the current detection to apparatus, to arrange the sensor compartment therebetween.

According to the assembling structure of the current detection apparatus as described above, the assembling structure can be provided which can realize the integration of the sensor main body and the bus bar in the simple configuration, which facilitates the assemblage of the current detection apparatus and which is suitable for reduction in size of the current detection apparatus.

According to the assembling structure of the current detection apparatus of the present invention, the current detection apparatus can be realized which has the sensor main body on which the magnetism detection element is provided, the bus bar to which the sensor main body can be attached, and the magnetism shield member which is mounted externally on the main body so as to cover the detecting portion of the main body and the perimeter of the bus bar from the outside, which is simple in configuration, which is easy to be assembled and which is suitable for reduction in size thereof.

Thus, the present invention has briefly been described. Further, the details of the present invention can be clarified further by perusing a mode for carrying out the present invention which will be described below by reference to the accompanying drawings.

DETAILED DESCRIPTION OF THE EXEMPLARY EMBODIMENTS

Hereinafter, exemplary embodiments of the present invention will be described in detail based on the drawings.

(First Embodiment)

Figure 1:
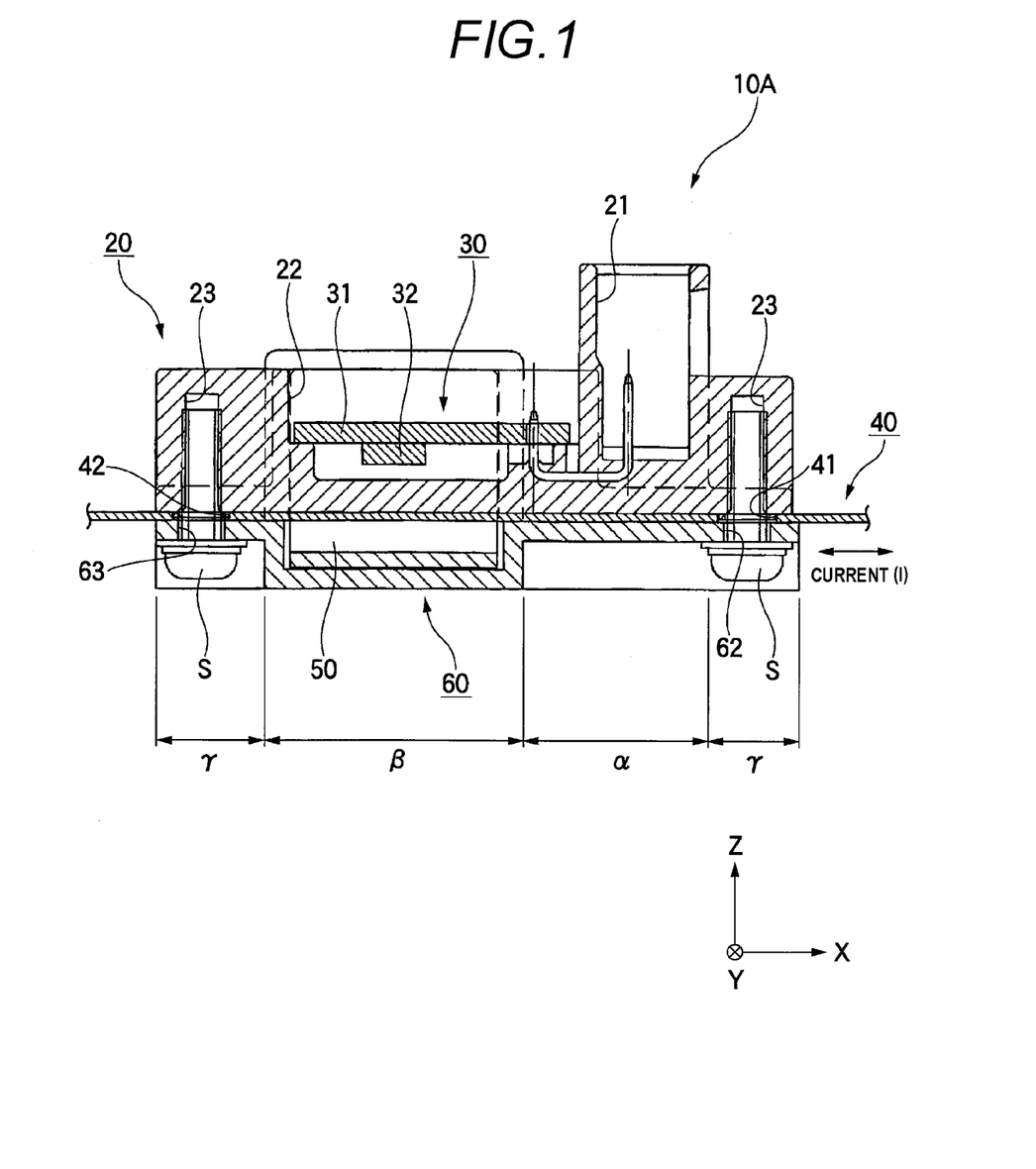
FIG. 1 is a sectional view showing the configuration of a current detection apparatus according to a first embodiment of the present invention.

FIG. 1 shows a current detection apparatus 10A according to a first embodiment which is fabricated by adopting an assembling structure of a current detection apparatus according to the present invention. The current detection apparatus 10A is placed within a vehicle and includes a housing 20, a sensor main body 30, a bus bar 40, a magnetism shield member 50 and a lower cover 60. The lower cover 60 is integrally fixed to the housing 20 with screws S so as to embrace the bus bar 40 and the magnetism shield member 50 therebetween.

The housing 20 of the embodiment is molded integrally of a non-magnetic and non-conductive material such as an appropriate synthetic resin. The housing 20 has parts of a fixing portion γ, a connector connecting portion α, a detecting portion β, and a fixing portion γ which are arranged sequentially in that order from an end portion side facing a battery (a right side in FIG. 1).

The connector connecting portion α is a portion where a connector connecting to a signal line (both elements are out of the drawing) is connected. In this embodiment, a compartment surrounded on four sides by erected walls (hereinafter, referred to as a connector compartment 21) indicates a connector. In addition, the signal line is designed to transmit an electric signal based on the intensity of a magnetic field detected by a magnetism detection element 32 of the detecting portion β, which will be described later, to a control IC unit, which is out of the drawing.

In the detecting portion β, a substrate 31 is placed within a magnetic sensor compartment 22 which is surrounded on four sides by walls, and the magnetism detection element 32 is mounted on the substrate 31.

The fixing portion γ is a portion through which a screw (in this embodiment, a tapping screw which forms its own internal thread) S is inserted. The screw S projects upwards from an upper surface of the lower cover 60 to fix together the lower cover 60 and the housing 20, which hold the bus bar 40 and the magnetism shield member 50 therebetween. A screw hole (in this embodiment, no thread is formed) 23 through which the screw S is inserted is opened in the fixing portion γ.

The sensor main body 30 has the magnetism detection element 32 for detecting a magnetic field generated from the bus bar 40, and a value of a current (I) which flows through the bus bar 40 is calculated based on the intensity of the magnetic field detected by the magnetism detection element 32. The sensor main body 30 of this embodiment has the substrate 31 placed within the magnetic sensor compartment 22 as described above, and the magnetism detection element 32 is mounted on the substrate 31.

The magnetism detection element 32 is designed to detect a magnetic flux which is generated relative to the current (I) in the bus bar 40 so as to turn around the perimeter of the current (I). Namely, the magnetism detection element 32 of this embodiment is disposed in the direction of a plane (that is, an X-Y plane) which detects a magnetic flux density of the current (I) which flows through the bus bar 40, and a magnetic flux in a Z direction which is normal to a plane of the bus bar 40 is not detected. In this way, the Z direction which is normal to the X-Y plane of the bus bar 40 is a direction in which the magnetism detection element 32 does not detect a magnetic flux.

A Hall element based on Hall effect is used for the magnetism detection element 32, and for example, an output voltage is outputted which is in proportion to a magnetic field density (which is generated in accordance with the intensity of the current I which flows through the bus bar 40) is outputted.

Figure 3:
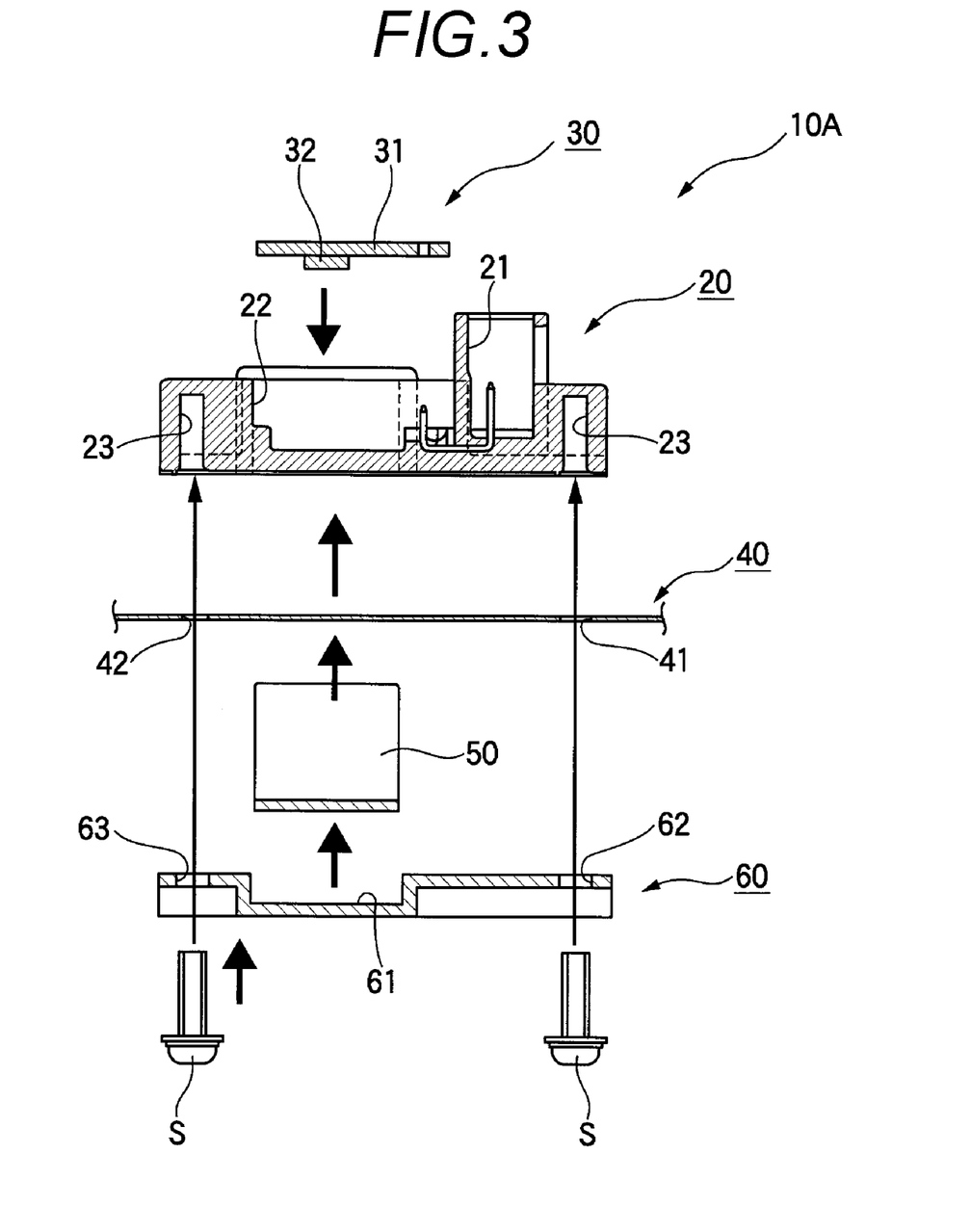
FIG. 3 is an explanatory diagram showing an assembling method of the current detection apparatus according to the first embodiment.

The bus bar 40 is attached integrally to one end portion of a wiring harness (not shown) which connects on-board electric equipment to a battery (both of which are not shown) at one end portion (a left end portion in FIG. 1). The bus bar 40 is also attached integrally to a terminal of the battery at the other end portion (a right end portion in FIG. 1). In the bus bar 40 of this embodiment, as is shown in FIG. 3, holes 41, 42 are opened through which tapping screws S are inserted.

Further, screwing holes 43, 44 are opened in the bus bar 40 on both end sides. For example, the bus bar 40 is screwed to the terminal of the battery (coupled to a negative side terminal, which is out of the drawing, to avoid a short-circuit) with a bolt or a screw by making use of one of the holes 43 and the bus bar 40 is screwed to the end portion of the wiring harness with a bolt or a screw by making use of the other hole 44.

The magnetism shield member 50 is formed of an appropriate material, in the case of the embodiment, for example, a magnetic material having spring properties and is mounted externally on the housing 20 so as to cover the detecting portion β of the housing 20 and the perimeter of the bus bar 40 from the outside. The magnetism shield member 50 is designed not only to cut off a transmission of magnetism from the outside but also to amplify the intensity of a magnetic field transmitted in an interior of the magnetism shield member 50. The magnetism shield member 50 of this embodiment exhibits a substantially box shape, which is opened on an upper surface and two lateral surfaces which confront each other. In order for the magnetism shield member 50 to be fixed integrally to the detecting portion β of the housing 20 in such a way as to embrace the detecting portion β of the housing 20 from below (outside), as described above, the magnetism shield member 50 is supported by the lower cover 60 which is securely screwed to the housing 20 with the tapping screws S from the outside (a lower side in FIG. 1) thereof.

Figure 2:
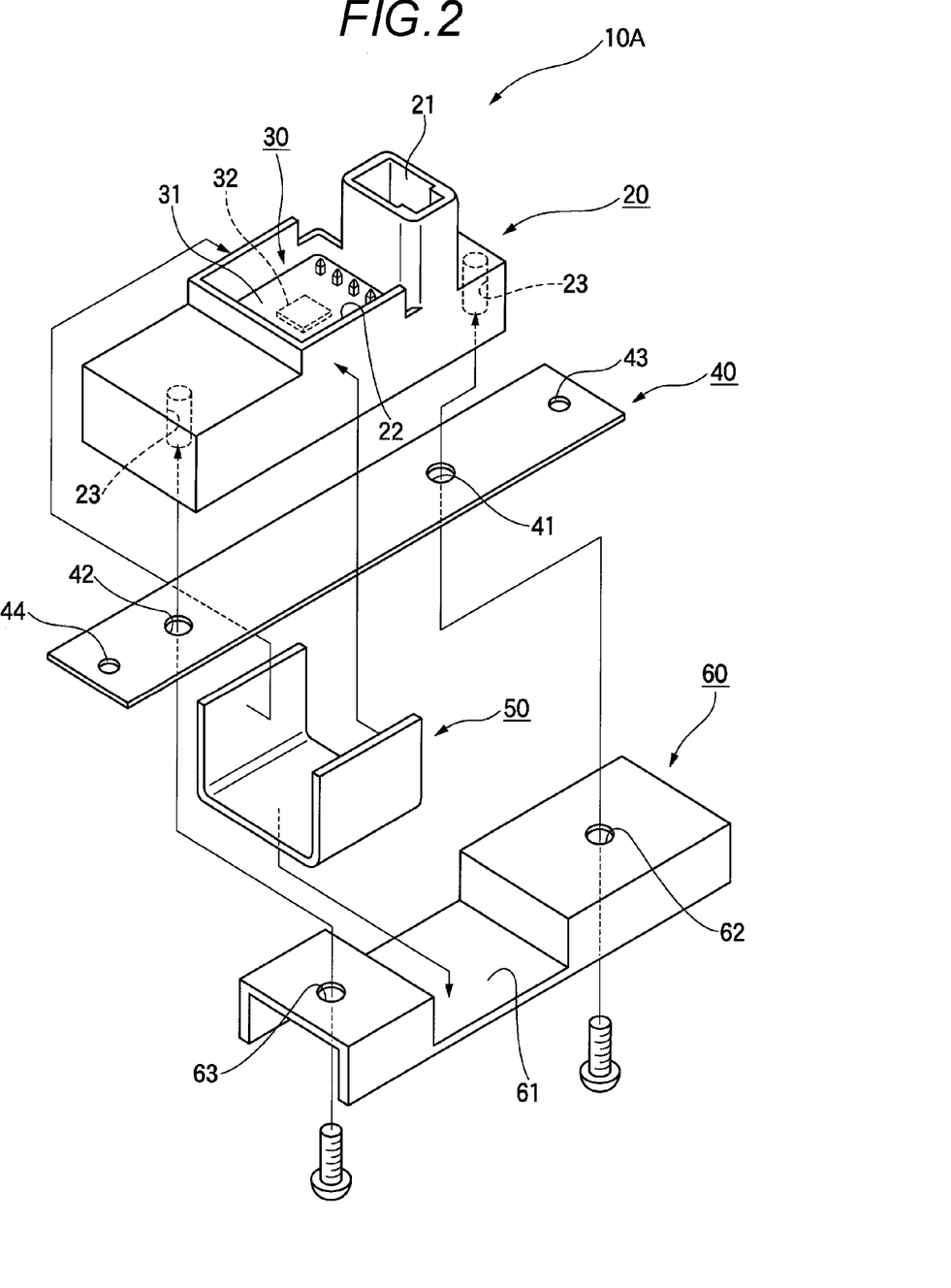
FIG. 2 is an exploded perspective view of the current detection apparatus according to the first embodiment.

As described above, the lower cover 60 is designed to be attached to the housing 20 with the tapping screws S so as to hold the magnetism shield member 50 therebetween (to detachably support the magnetism shield member 50 from therebelow). In particular, as is shown in FIG. 2, a stepped portion 61, which is depressed downwards one step, is formed at a central portion of the lower cover 60 so that a lower portion of the magnetism shield member 50 is accommodated therein while being supported, and holes 62, 63 are opened in the lower cover 60 at both end portion sides so that taping screws S are screwed thereinto.

Consequently, according to the in-vehicle current detection apparatus 10A according to the embodiment, the magnetism shield member 50 is provided to thereby suppress unfavorable external electromagnetic influence, thereby an accurate current detection being enabled.

For example, although depending upon vehicle systems to which the in-vehicle current detection apparatus 10A according to the embodiment is applied, in a case where a magnetic field is generated on the perimeter of the Hall element which is used as the magnetism detection element 32 or in a case where a relay or a motor is placed in proximity to the current detection apparatus 10A, there exists a possibility that an accurate magnetism detection cannot be implemented due to the magnetic field so generated. In addition, influences from terrestrial magnetism and high-tension cables are considered as influences from an environment where the vehicle is running. However, according to the current detection apparatus 10A according to the embodiment, the magnetism shield member 50 is provided, and the magnetism shield member 50 effectively prevents sensor outputs from being caused to vary largely due to the influences described above.

Incidentally, in the case of a current detection apparatus (a current sensor) which is fabricated by fastening a magnetism shield plate by means of clamping, there is caused a serious problem that a magnetostriction is easily generated. However, with the current detection apparatus 10A according to the first embodiment which is fabricated based on the assemblage utilizing the tapping screws S, no such magnetostriction is generated (or such a magnetostriction is reduced to as low a level as possible), thereby making it possible to realize the highly reliable current sensor.

Next, an assembling method of the current detection apparatus 10A according to the embodiment will be described by reference to FIGS. 2 and 3.

(1) Firstly, the magnetism detection element 32 is mounted on the substrate 31.

(2) Next, the substrate 31 is turned upside down so that the magnetism detection element 32 is positioned on a lower surface of the substrate 31, and the substrate 31 is then assembled in the magnetic sensor compartment 22 of the housing 20.

(3) Thereafter, the housing 20 is turned upside down, and the bus bar 40 is then placed thereon.

(4) Next, the magnetism shield member 50 is attached so as to hold the housing 20 from both sides thereof.

(5) Lastly, the lower cover 60 is placed over the housing 20 so that the magnetism shield member 50 is covered by a stepped portion 61, and thereafter, the lower cover 60 is screwed down with the tapping screws S. Prior to fastening with the tapping screws, the respective members are properly positioned relative to each other via the holes 23 in the housing 20, the holes 41, 42 in the bus bar 40 and the holes 62, 63 in the lower cover 60 so that these holes are aligned with each other.

Consequently, according to the assembling structure of the in-vehicle current detection apparatus 10A according to the embodiment, since the magnetism shield member 50 and the bus bar 40 are fastened by the lower cover 60, the magnetism shield member 50 does not have to be clamped for attachment to the housing 30 and the bus bar 40. Consequently, since a risk can be avoided that strain is generated in the magnetism shield member 50 when it is clamped, and hence, a resulting or subsequent risk can be avoided that magnetic hysteresis is generated in association therewith, the magnetic sensor can be formed which is improved with respect to detection accuracy and which is highly reliable.

In addition, in this embodiment, prior to screwing the lower cover 60, since the respective members can be properly positioned relative to each other via the holes 23 in the housing 20, the holes 41, 42 in the bus bar 40 and holes 62, 63 in the lower cover 60 so that these holes are aligned with each other via these holes, the assembling operation can be performed quickly.

In the embodiment, the bus bar 40 and the lower cover 60 are described as being fixed integrally to the housing 20 by inserting the screws S through part of the bus bar 40 and part of the lower cover 60 to screw them down. In addition to this configuration, a configuration may be adopted in which projecting portions which are provided to project upwards from the upper surface of the lower cover 60 are fitted in the holes 23 in the housing 20, so that the bus bar 40 and the lower cover 60 are fixed integrally to the housing 20 by virtue of frictional force generated between the projecting portions and the holes 23.

(Second Embodiment)

Figure 4:
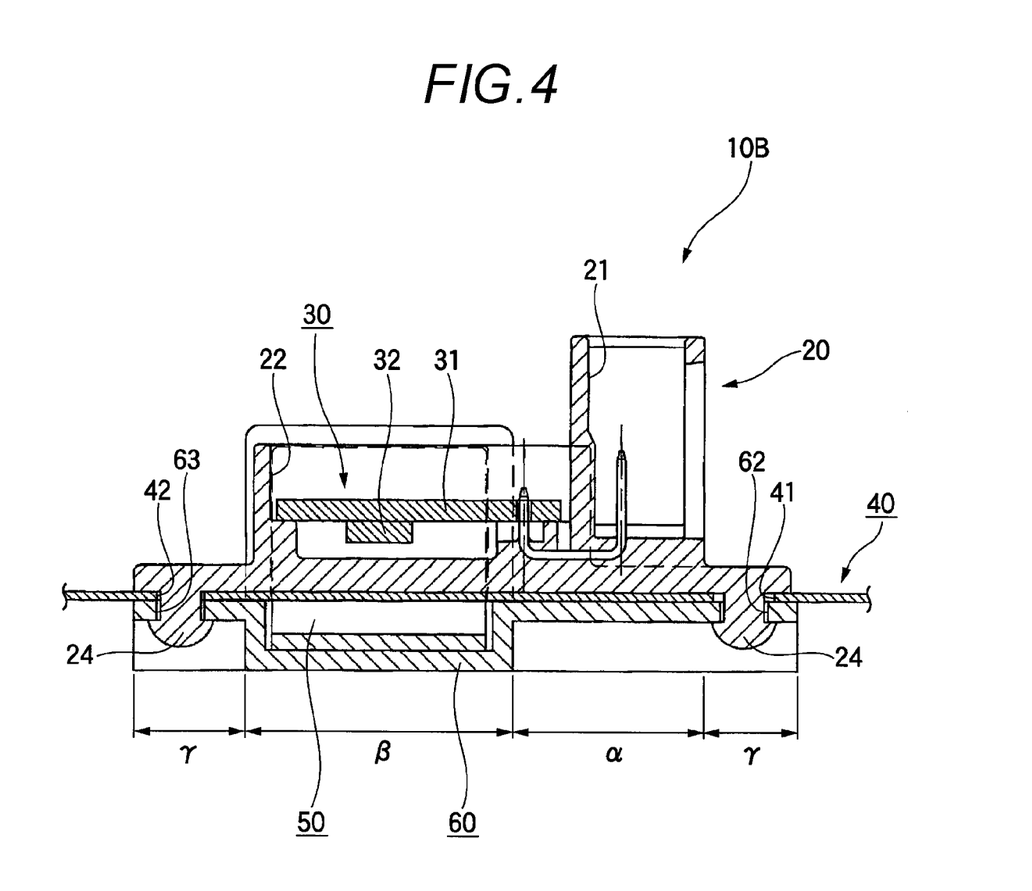
FIG. 4 is a sectional view showing the configuration of a current detection apparatus according to a second embodiment of the present invention.
Figure 5:
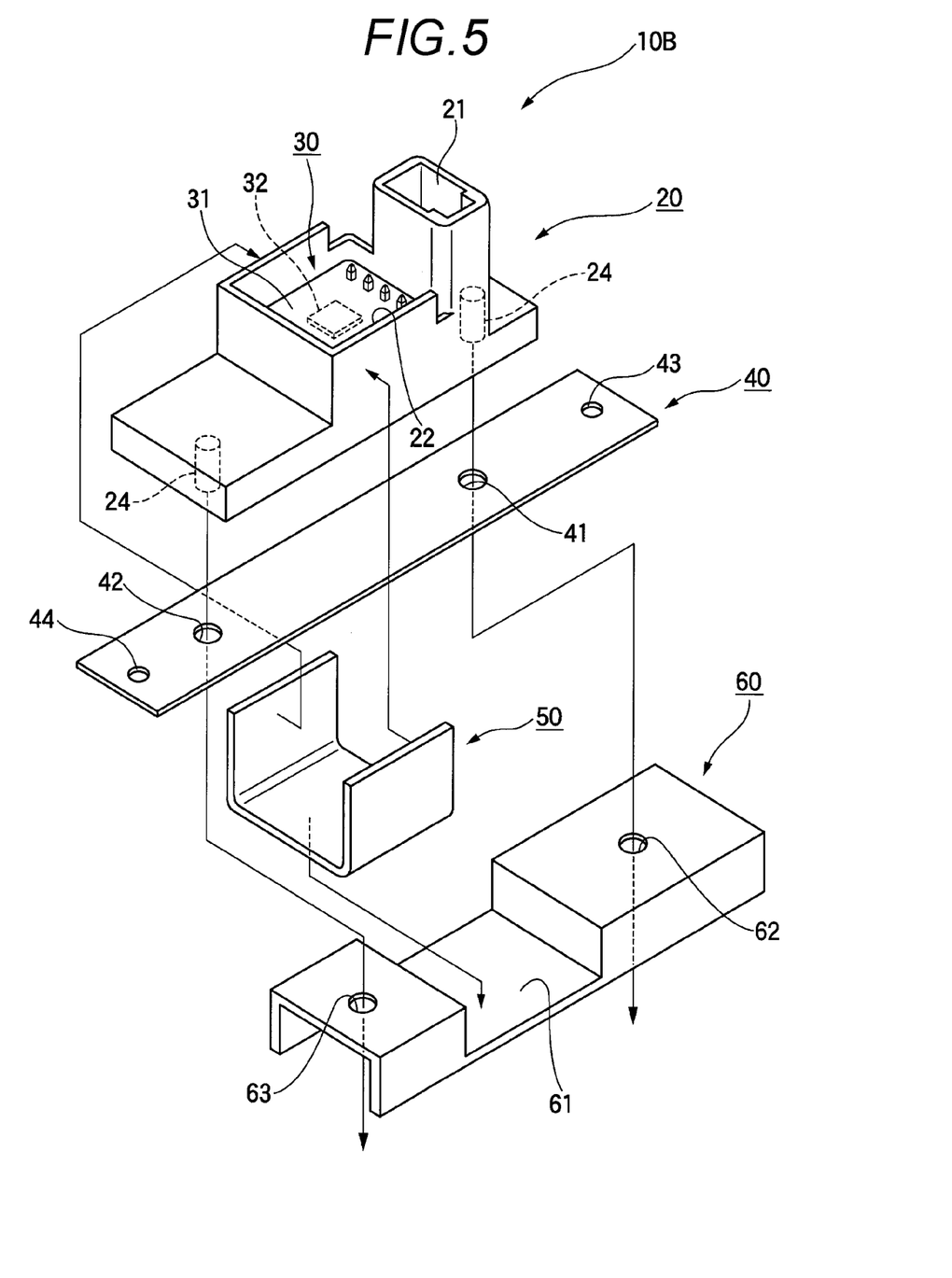
FIG. 5 is an exploded perspective view of the current detection apparatus according to the second embodiment.
Figure 6:
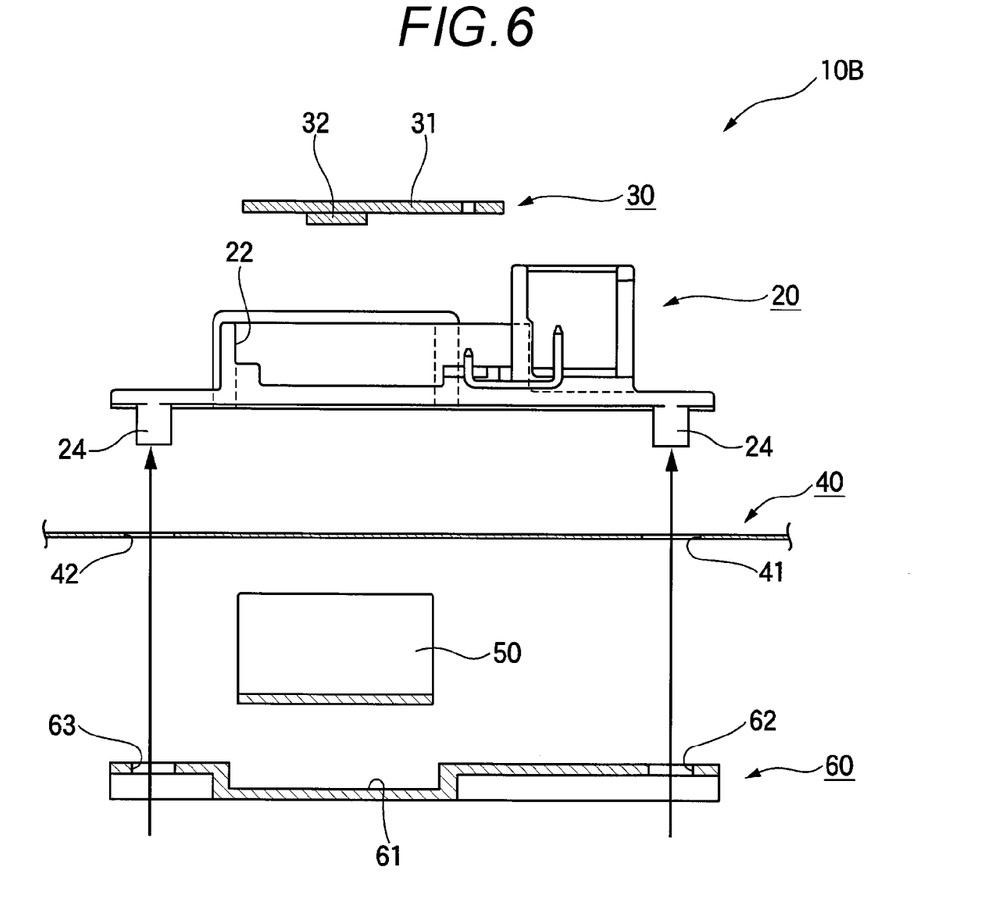
FIG. 6 is an explanatory diagram showing an assembling method of the current detection apparatus according to the second embodiment.

Next, referring to FIGS. 4 to 6, a second embodiment of the present invention will be described. Note that same reference numerals will be given to same portions as those of the first embodiment, and a repeated description thereof will be omitted.

A current detection apparatus 10B of this embodiment differs from the current detection apparatus 10A of the first embodiment in that in place of the screws (the tapping screws) S, substantially cylindrical resins 24 are provided at fixing portions y on both end sides of a housing 20 so as to project downwards from a lower surface of the housing 20. These substantially cylindrical resins 24 are inserted through holes 62, 63, whereas in the first embodiment, the screws S are inserted through these holes.

These substantially cylindrical resins 24 are softened and fused through thermal welding (or hot-air welding) for deformation. Distal end portions of the substantially cylindrical resins 24 which have passed through the holes 41, 42 in a bus bar 40 and holes 62, 63 in a lower cover 60 are welded to peripheries of the holes, specifically, the holes 41, 42 in the bus bar 40 and holes 62, 63 in a lower cover 60 or close the holes 62, 63 in the lower cover 60, whereby the bus bar 40 and the lower cover 60 are secured integrally to the housing 20. In addition, by the bus bar 40 and the lower cover 60 being secured integrally to the housing 20, a magnetism shield member 50, which is provided to hold the housing 20, is fixed integrally to the housing 20 at the same time.

Consequently, in the current detection apparatus 10B of this embodiment, the same assembling procedure as that of the first embodiment can be adopted. However, in the case of the second embodiment, the assembling operation can be performed with no screw (tapping screw) S required. In addition, also in the current detection apparatus 10B of this embodiment, similar to the first embodiment, since a risk can be avoided that strain is generated in the magnetism shield member 50 when it is clamped, and hence, a resulting or subsequent risk can be avoided that magnetic hysteresis is generated in association therewith, the magnetic sensor can be formed which is improved with respect to detection accuracy and which is highly reliable.

In addition, prior to the thermal welding, since the respective members can be properly positioned relative to each other via the holes 23 in the housing 20, the holes 41, 42 in the bus bar 40 and holes 62, 63 in the lower cover 60 so that these holes are aligned with each other, the assembling operation can be performed quickly.

In the second embodiment, the bus bar 40 and the lower cover 60 are described as being secured integrally to the housing 20 by the distal end portions of the substantially cylindrical resins 24 which have passed through the holes 41, 42 in the bus bar 40 and the holes 62, 63 in the lower cover 60 being thermally welded. In addition to this configuration, a configuration may be adopted in which the substantially cylindrical resins 24 are fitted in the holes 62, 63 so as to generate frictional force therebetween, so that the bus bar 40 and the lower cover 60 are integrally fixed to the housing 20 by virtue of the frictional force so generated.

(Third Embodiment)

Figure 7:
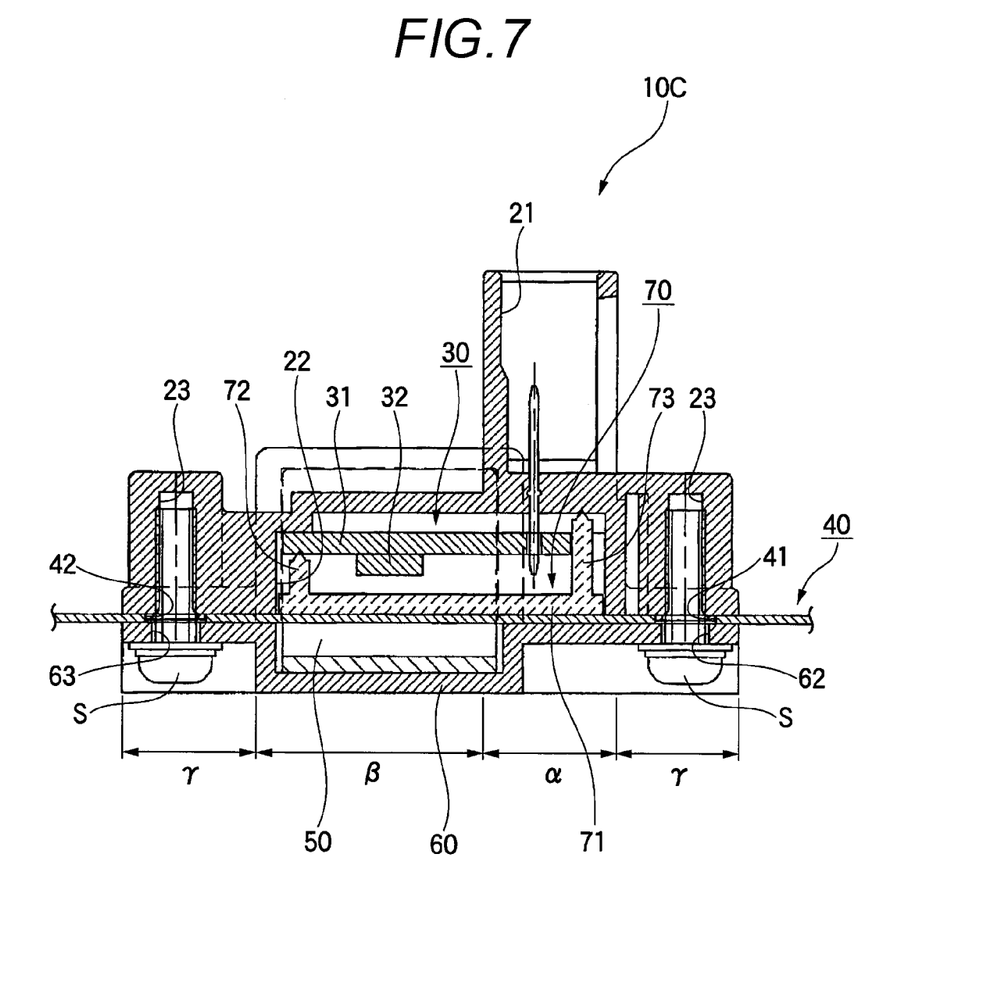
FIG. 7 is a sectional view showing the configuration of a current detection apparatus according to a third embodiment of the present invention.
Figure 8:
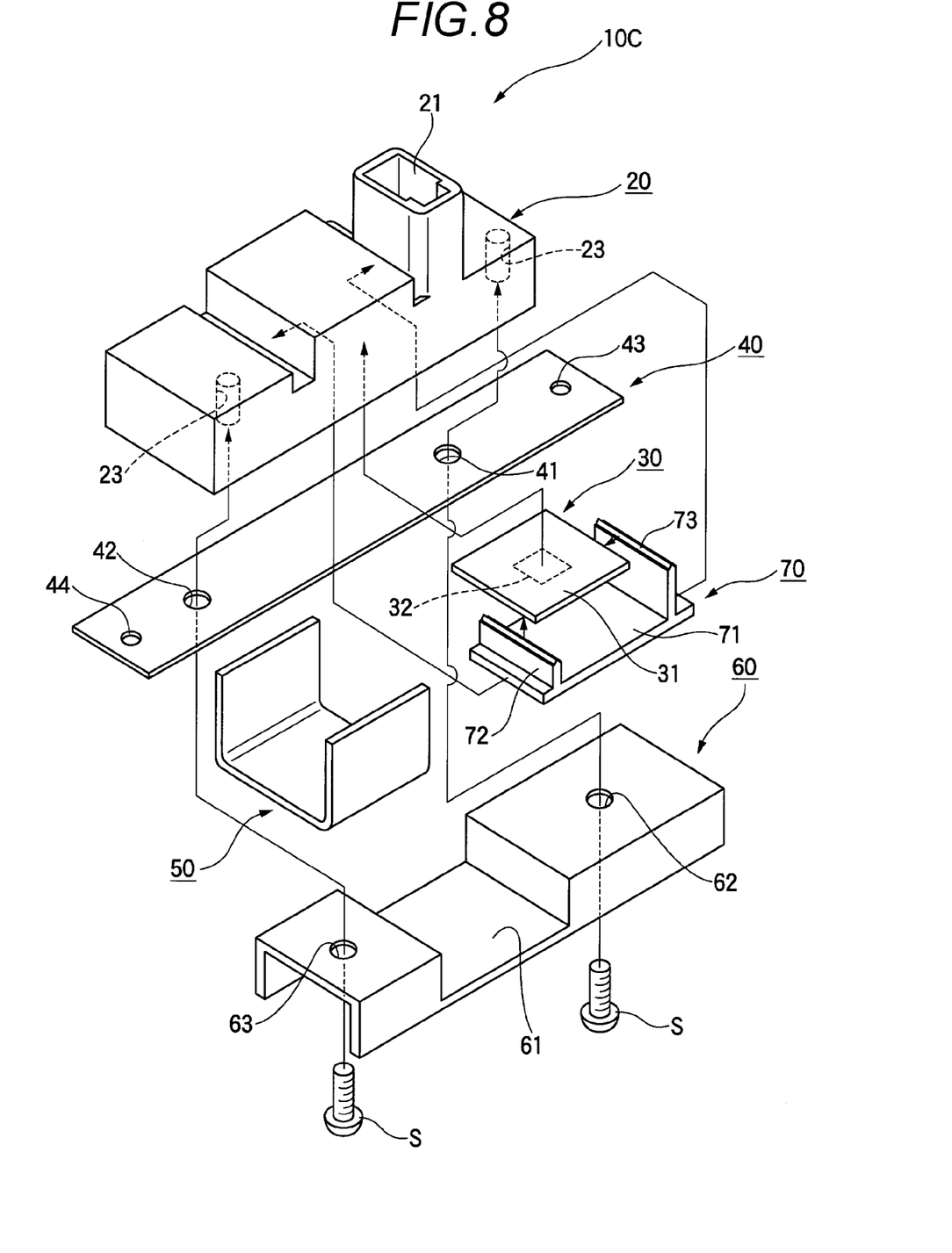
FIG. 8 is an exploded perspective view of the current detection apparatus according to the third embodiment.
Figure 9:
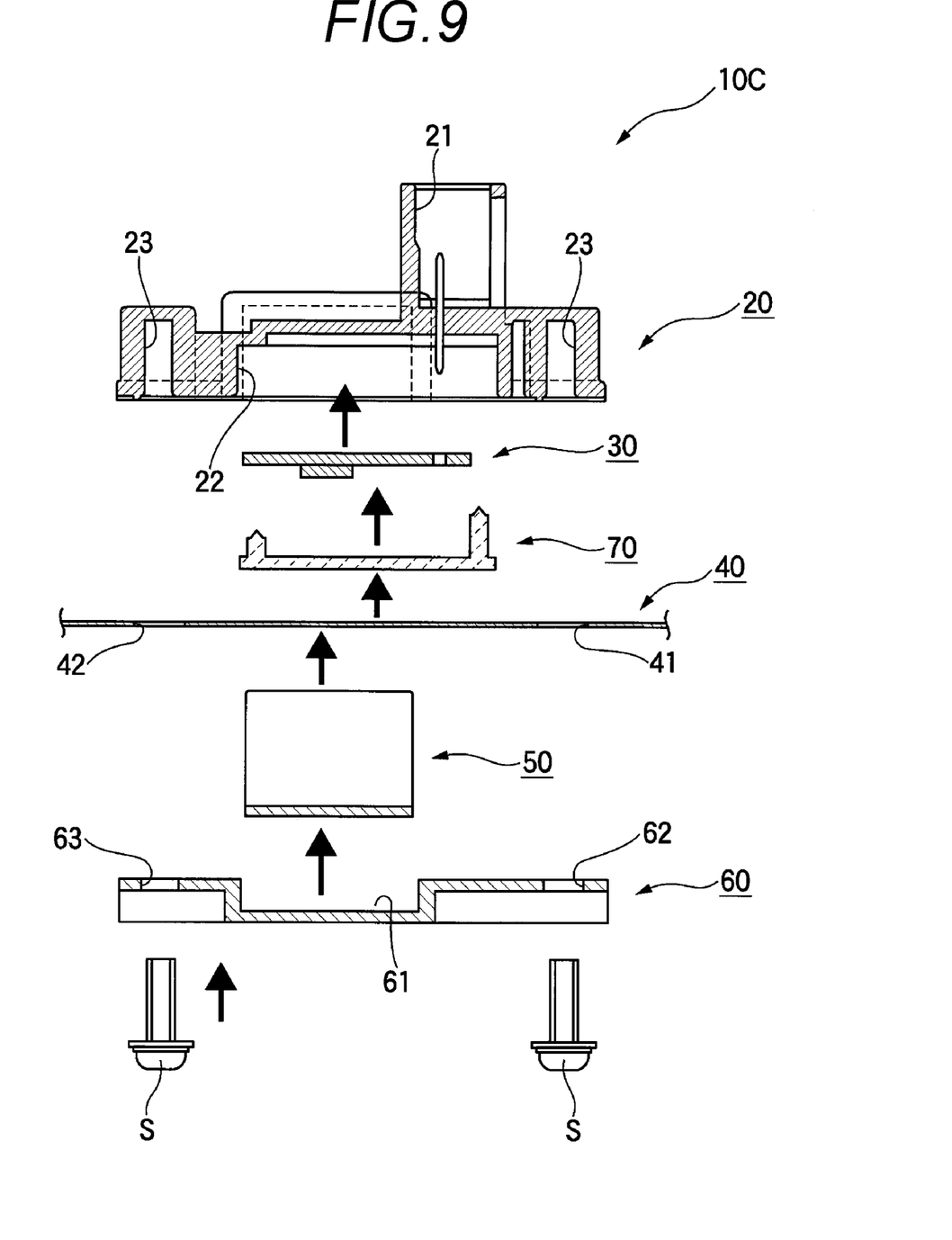
FIG. 9 is an explanatory diagram showing an assembling method of the current detection apparatus according to the third embodiment.

Next, referring to FIGS. 7 to 9, a third embodiment of the present invention will be described. Note that same reference numerals will be given to same portions as those of the first embodiment, and a repeated description thereof will be omitted.

A current detection apparatus 10C of this embodiment differs from the current detection apparatus 10A of the first embodiment in that a magnetic sensor compartment 22 is made to open in a lower surface of a housing 20 and that a sensor main body 30 is fixed in place within the magnetic sensor compartment 22 with a spacer 70 which covers an opening of the magnetic sensor compartment 22.

In the spacer 70, a movably supporting projection 72 and a positioning projection 73 are provided on a surface of a base portion 71, whereby with the spacer 70 held by the housing 20 and a bus bar 40 therebetween, the movably supporting projection 72 supports a lower surface of a substrate 31 in a line contact condition and the positioning projection 73 is brought into abutment with a lateral side surface of the substrate 31 so as to prevent the positional shifting and vibration of the substrate 31.

Consequently, according to the embodiment, even in the event that the vehicle receives a large impact to cause the bus bar 40 connecting to the terminal of the battery to vibrate, a sensor main body 30 rests on the bus bar 40 and is fixed by the spacer 70, whereby there occurs no such situation that the sensor main body 30 is shifted or displaced relative to the bus bar 40. Consequently, the impact does not affect the current detection accuracy of the current sensor in any way.

Nest, referring to FIGS. 8 and 9, an assembling method of the current detection apparatus 10C according to the embodiment will be described.

(1) Firstly, a magnetism detection element 32 is mounted on the substrate 31.

(2) Next, the housing 20 is turned upside down, and the substrate 31 is assembled in a magnetic sensor compartment 22 of the housing 20 via the spacer so that the magnetism detection element 32 is oriented upwards within the magnetic sensor compartment 22.

(3) Thereafter, with the housing 20 kept upside down, the bus bar 40 is placed.

(4) Next, a magnetism shield member 50 is mounted so as to hold the housing 20 on both sides thereof.

(5) Lastly, a lower cover 60 is placed over the housing 20 so that a stepped portion 61 covers the magnetism shield member 50, and thereafter, the lower cover 60 is screwed to the housing 20 with tapping screws S. Prior to the screwing of the lower case 60, similar to the first embodiment, the respective members are positioned via holes 23 in the housing 20, holes 41, 42 in the bus bar 40 and holes 62, 63 in the lower cover 60 so that these holes are aligned with each other.

Consequently, according to the assembling structure of the in-vehicle current detection apparatus 10C according to the embodiment, since the magnetism shield member 50 and the bus bar 40 are fastened in place by the lower cover 60 and the sensor main body 30 is fastened in place by the bus bar 40 and the spacer 70, the magnetism shield member 50 does not have to be clamped to be attached to the housing 20 and the bus bar 40. Consequently, since a risk can be avoided that strain is generated in the magnetism shield member 50 when it is clamped, and hence, a resulting or subsequent risk can be avoided that magnetic hysteresis is generated in association therewith, the magnetic sensor can be formed which is improved with respect to detection accuracy and which is highly reliable. In addition, in this embodiment, too, prior to screwing the lower cover 60, since the respective members can be properly positioned relative to each other via the holes 23 in the housing 20, the holes 41, 42 in the bus bar 40 and the holes 62, 63 in the lower cover 60 so that these holes are aligned with each other, the assembling operation can be performed quickly.

(Fourth Embodiment)

Figure 10:
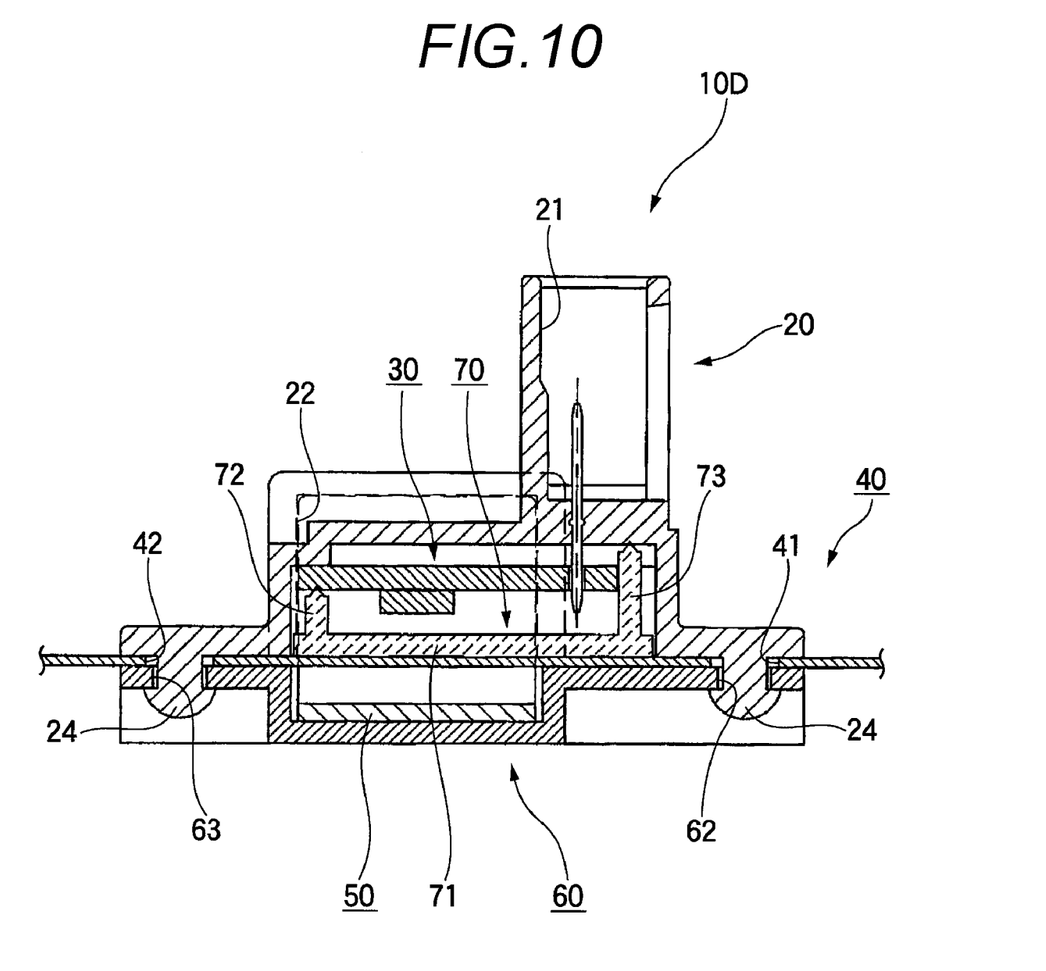
FIG. 10 is a sectional view showing the configuration of a current detection apparatus according to a fourth embodiment of the present invention.
Figure 11:
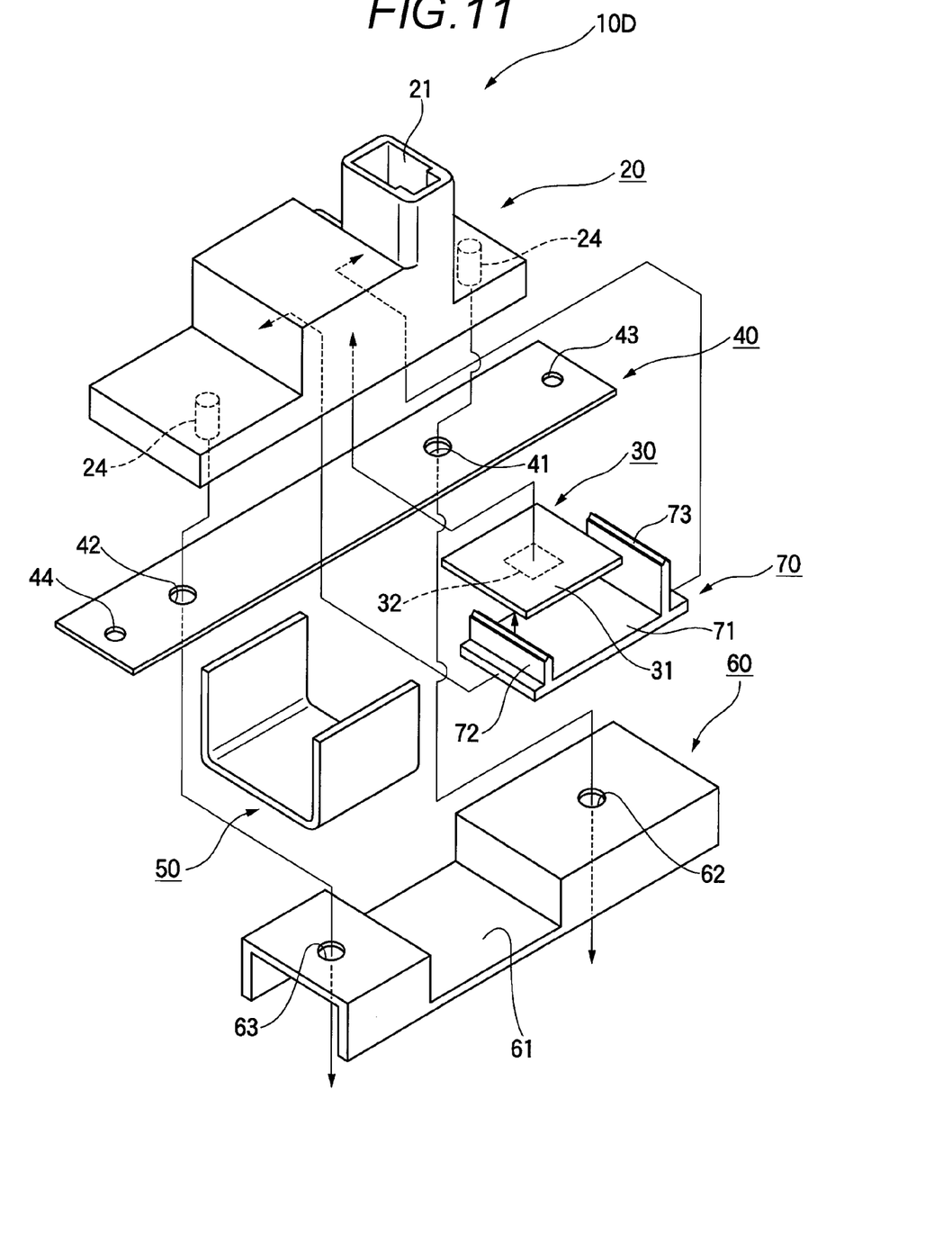
FIG. 11 is an exploded perspective view of the current detection apparatus according to the fourth embodiment.
Figure 12:
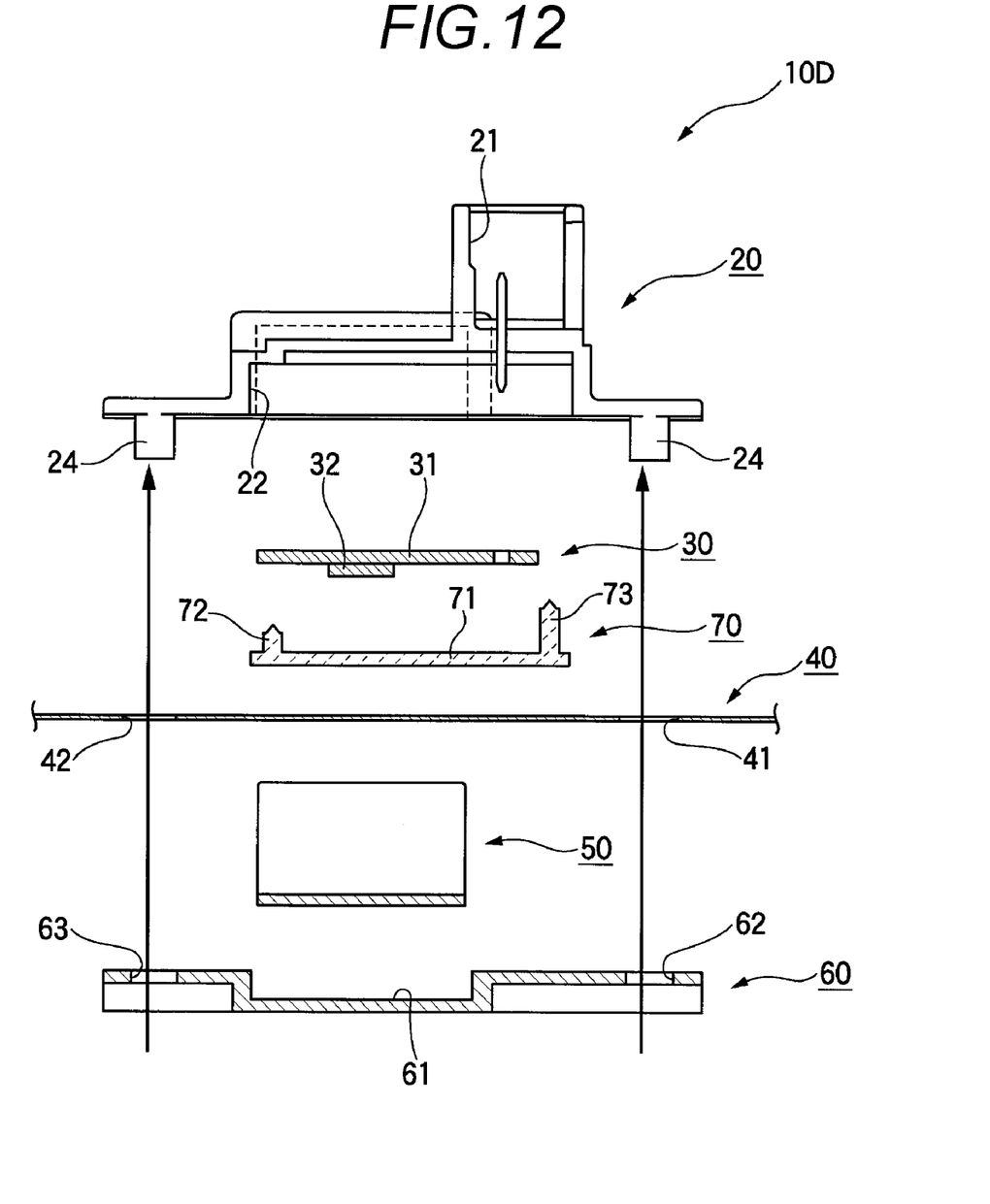
FIG. 12 is an explanatory diagram showing an assembling method of the current detection apparatus according to the fourth embodiment.

Next, referring to FIGS. 10 to 12, a fourth embodiment of the present invention will be described. Note that same reference numerals will be given to same portions as those of the first to third embodiments, and a repeated description thereof will be omitted.

A current detection apparatus 10D of this embodiment differs from the current detection apparatus 10C of the third embodiment in that in place of the screws (the tapping screws) S, substantially cylindrical resins 24 are provided at fixing portions γ on both end sides of a housing 20 so as to project downwards from a lower surface of the housing 20. These substantially cylindrical resins 24 are inserted through holes 62, 63, whereas in the first embodiment, the screws S are inserted through these holes.

Namely, these substantially cylindrical resins 24 are, as with the second embodiment, softened and fused through thermal welding (or hot-air welding) for deformation. Distal end portions of the substantially cylindrical resins 24 which have passed through the holes 41, 42 in a bus bar 40 and holes 62, 63 in a lower cover 60 are welded to peripheries of the holes, specifically, the holes 41, 42 in the bus bar 40 and holes 62, 63 in a lower cover 60 or close the holes 62, 63 in the lower cover 60, whereby the bus bar 40 and the lower cover 60 are secured integrally to the housing 20. In addition, by the bus bar 40 and the lower cover 60 being secured integrally to the housing 20, a magnetism shield member 50, which is provided to hold the housing 20, is fixed integrally to the housing 20 at the same time.

Consequently, also in the current detection apparatus 10D of this embodiment, the same assembling procedure as that of the third embodiment can be adopted. The assembling operation can be performed with no screw (tapping screw) S required. In addition, also in the current detection apparatus 10D of this embodiment, similar to the first to third embodiments, since a risk can be avoided that strain is generated in the magnetism shield member 50 when it is clamped, and hence, a resulting or subsequent risk can be avoided that magnetic hysteresis is generated in association therewith, the magnetic sensor can be formed which is improved with respect to detection accuracy and which is highly reliable. In addition, prior to the thermal welding, since the respective members can be properly positioned relative to each other via the holes 41, 42 in the bus bar 40 and the holes 62, 63 in the lower cover 60 so that these holes are aligned with each other, the assembling operation can be performed quickly.

Note that the current detection apparatus of the present invention is not limited to the application as part of the in-vehicle system but can be applied to current detection apparatuses for use in various industrial fields, provided that a bus bar is embraced therein.

What is claimed is:

1. An assembling structure of a current detection apparatus comprising:
   a bus bar;
   a sensor main body having a magnetism detection element which detects a magnetism generated from the bus bar and adapted to calculate a value of a current which flows through the bus bar based on the detected magnetism;
   a housing having a sensor compartment which accommodates the sensor main body, wherein a lower surface of the housing faces one of surfaces of the bus bar;
   a magnetism shield member mounted externally on the housing so that the sensor main body and the bus bar are positioned in an interior of the magnetism shield member;
   a cover at least part of an upper surface of which faces the other surface of the bus bar, so as to hold the bus bar and the magnetism shield member by the at least part of the upper surface of the cover and the lower surface of the housing therebetween;
   a projecting portion formed on the cover, which projects upwards from the upper surface of the cover;
   a hole formed in the bus bar, through which the projecting portion of the cover is inserted when the bus bar and the magnetism shield member are held by the at least part of the upper surface of the cover and the lower surface of the housing; and
   a hole formed in the lower surface of the housing, which is adapted to fit on the projecting portion which passes through the hole in the bus bar when the bus bar and the magnetism shield member are held by the at least part of the upper surface of the cover and the lower house of the housing.

2. The assembling structure as set forth in claim 1, wherein the projecting portion of the cover is formed by a screw which penetrates through the cover from the lower surface towards the upper surface of the cover.

3. The assembling structure as set forth in claim 1, comprising a spacer which covers an opening in the sensor compartment which is made to open in the lower surface of the housing, wherein
   the spacer is held by the housing and the bus bar therebetween when the bus bar and the magnetism shield member are held by the at least part of the upper surface of the cover and the lower surface of the housing excluding the opening to thereby fix the sensor main body accommodated in the sensor compartment in place in the sensor compartment.

4. The assembling structure as set forth in claim 1, wherein the projecting portion, the hole in the bus bar, and the hole in the housing are provided in two, respectively, and
   the two projecting portions, the two holes in the bus bar, and the two holes in the housing are disposed at both sides of the current detection apparatus, to arrange the sensor compartment therebetween.

5. An assembling structure of a current detection apparatus comprising:
- a bus bar;
- a sensor main body having a magnetism detection element which detects a magnetism generated from the bus bar and adapted to calculate a value of a current which flows through the bus bar based on the detected magnetism;
- a housing having a sensor compartment which accommodates the sensor main body, wherein a lower surface of the housing faces one of surfaces of the bus bar;
- a magnetism shield member mounted externally on the housing so that the sensor main body and the bus bar are positioned in an interior of the magnetism shield member;
- a cover at least part of an upper surface of which faces the other surface of the bus bar, so as to hold the bus bar and the magnetism shield member by the at least part of the upper surface of the cover and the lower surface of the housing therebetween;
- a projecting portion formed on the housing, which projects downwards from the lower surface of the housing;
- a hole formed in the bus bar, through which the projecting portion of the housing is inserted when the bus bar and the magnetism shield member are held by the at least part of the upper surface of the cover and the lower surface of the housing; and
- a hole formed in the upper surface of the cover, which is adapted to fit on the projecting portion which passes through the hole in the bus bar when the bus bar and the magnetism shield member are held by the at least part of the upper surface of the cover and the lower house of the housing.

6. The assembling structure as set forth in claim 5, wherein the hole formed in the cover is formed so as to extend from the upper surface to the lower surface of the cover, and the projecting portion of the housing is provided to project from the lower surface of the housing, and a distal end portion of the projecting portion which passes through the hole in the bus bar and the hole in the cover is thermally welded in the holes in the cover.

7. The assembling structure as set forth in claim 5, comprising a spacer which covers an opening in the sensor compartment which is made to open in the lower surface of the housing, wherein
the spacer is held by the housing and the bus bar therebetween when the bus bar and the magnetism shield member are held by the at least part of the upper surface of the cover and the lower surface of the housing excluding the opening to thereby fix the sensor main body accommodated in the sensor compartment in place in the sensor compartment.

8. The assembling structure as set forth in claim 5, wherein the projecting portion, the hole in the bus bar, and the hole in the cover are provided in two, respectively, and
the two projecting portions, the two holes in the bus bar, and the two holes in the cover are disposed at both sides of the current detection apparatus, to arrange the sensor compartment therebetween.

* * * * *